(12) United States Patent
Bikumandla et al.

(10) Patent No.: US 8,642,938 B2
(45) Date of Patent: Feb. 4, 2014

(54) SHARED TIME OF FLIGHT PIXEL

(75) Inventors: Manoj Bikumandla, San Jose, CA (US); Sasidhar Saladi, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 240 days.

(21) Appl. No.: 13/350,609

(22) Filed: Jan. 13, 2012

(65) Prior Publication Data

US 2013/0181119 A1   Jul. 18, 2013

(51) Int. Cl.
*H01L 27/00*    (2006.01)
*G01C 3/00*     (2006.01)
*G01C 3/08*     (2006.01)

(52) U.S. Cl.
USPC .......................... 250/208.1; 356/3; 356/3.04

(58) Field of Classification Search
USPC ........................................ 250/208.1; 356/3–8
See application file for complete search history.

(56) References Cited

U.S. PATENT DOCUMENTS

| | | | |
|---|---|---|---|
| 6,580,496 B2 | 6/2003 | Bamji et al. | |
| 7,595,827 B2 * | 9/2009 | Sato ............................ | 348/296 |
| 2007/0158770 A1 | 7/2007 | Kawahito | |
| 2010/0020209 A1 | 1/2010 | Kim | |
| 2011/0157354 A1 | 6/2011 | Kawahito | |
| 2011/0194099 A1 | 8/2011 | Kamiyama | |
| 2011/0198481 A1 | 8/2011 | Kim et al. | |
| 2011/0199602 A1 | 8/2011 | Kim et al. | |

FOREIGN PATENT DOCUMENTS

KR    2011-0093212 A    8/2011

OTHER PUBLICATIONS

PCT/US2012/072146—International Search Report and Written Opinion, Mailed Apr. 30, 2013 (9 pages).
Gokturk et al., "A Time-of-Flight Depth Sensor—System Description, Issues and Solutions," IEEE, Proceedings of the 2004 IEEE Computer Society Conference on Computer Vision and Pattern Recognition Workshops, 2004 (9 pages).
Kim et al., "A Three-Dimensional Time-of-Flight CMOS Image Sensor with Pinned-Photodiode Pixel Structure," IEEE Electronic Device Letters, vol. 31, No. 11, Nov. 2010 (3 pages).
Betta et al., "Design and Characterization of Current-Assisted Photonic Demodulators in 0.18-μm CMOS Technology," IEEE Transactions on Electron Devices, vol. 58, No. 6, Jun. 2011 (8 pages).
Lee et al., "Dark Current Suppression During High Speed Photogate Modulation for 3D ToF Imaging Pixel," Proceedings 2011 International Image Sensor Workshop, Hokkaido, Japan, Jun. 8-11, 2011 (4 pages).

(Continued)

*Primary Examiner* — Thanh Luu
*Assistant Examiner* — Renee Naphas
(74) *Attorney, Agent, or Firm* — Blakely Sokoloff Taylor & Zafman LLP

(57) ABSTRACT

A time of flight pixel includes a photodiode that accumulates charge in response to light incident upon the photodiode. A first transfer transistor is couple between the photodiode and a first charge storage device to selectively transfer charge to the first charge storage device from the photodiode. A second transfer transistor coupled between the photodiode and a second charge storage device to selectively transfer charge to the second charge storage device from the photodiode. An enable transistor is coupled between the first charge storage device and a readout node coupled to the second charge storage device to selectively couple the first charge storage device to the readout node. An amplifier transistor having a gate is also coupled to a readout node.

26 Claims, 5 Drawing Sheets

(56) References Cited

OTHER PUBLICATIONS

Mahdi et al., "Lateral Drift-Field Photodetector for High Speed 0.35 µm CMOS Imaging Sensors Based on Non-Uniform Lateral Doping Profile—Design, Theoretical Concepts, and TCAD Simulations," Department of Optical Sensor Systems: Fraunhofer Institute for Microelectronics Circuits and System, Duisburg, Germany, (no date) (4 pages).

* cited by examiner

SHARED TIME OF FLIGHT PIXEL

BACKGROUND INFORMATION

1. Field of the Disclosure

This invention is related to image sensors. In particular, embodiments of the present invention are related to three dimensional image sensors.

2. Background

Interest in three dimensional (3D) cameras is increasing as the popularity 3D applications continues to grow in applications such as imaging, movies, games, computers, user interfaces, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the three dimensional images. In addition, this technique is complex and therefore requires significant computer processing power in order to create the 3D images in real time.

For applications that require the acquisition of 3D images in real time, active depth imaging systems based on the optical time of flight measurement are sometimes utilized. These time of flight systems typically employ a light source that directs light at an object, a sensor that detect the light that is reflected from the object, and a processing unit that calculates the distance to the object based on the round trip time that it takes for light to travel to and from an object. In typical time of flight sensors, photodiodes are often used because of the high transfer efficiency from the photo detection regions to the sensing nodes. Known time of flight sensors typically include two independent copies of photodiodes, reset transistors, source follower transistors and row select transistors for each pixel in order to operate. The inclusion of all of these devices in each pixel of time of flight sensors have the consequence of the time of flight sensors having significantly larger pixel sizes as well as poor fill factors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for acquiring time of flight and depth information using a 3D time of flight sensor are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

As will be shown, examples of a time of flight sensor with shared devices in each pixel are disclosed. By sharing the devices in each pixel, the number of active devices in each pixel is significantly reduced compared to known time of flight sensor solutions. Thus, the disclosed time of flight pixel architecture enjoys improved fill factor with the reduced number of active devices in each pixel. In addition, the reduced number of active devices in each pixel helps to improve sensitivity, timing and charge transfer speed compared to known pixels. Furthermore, with the reduced number of devices and contacts per pixel, yields are improved and dark current is reduced.

Figure 1A:
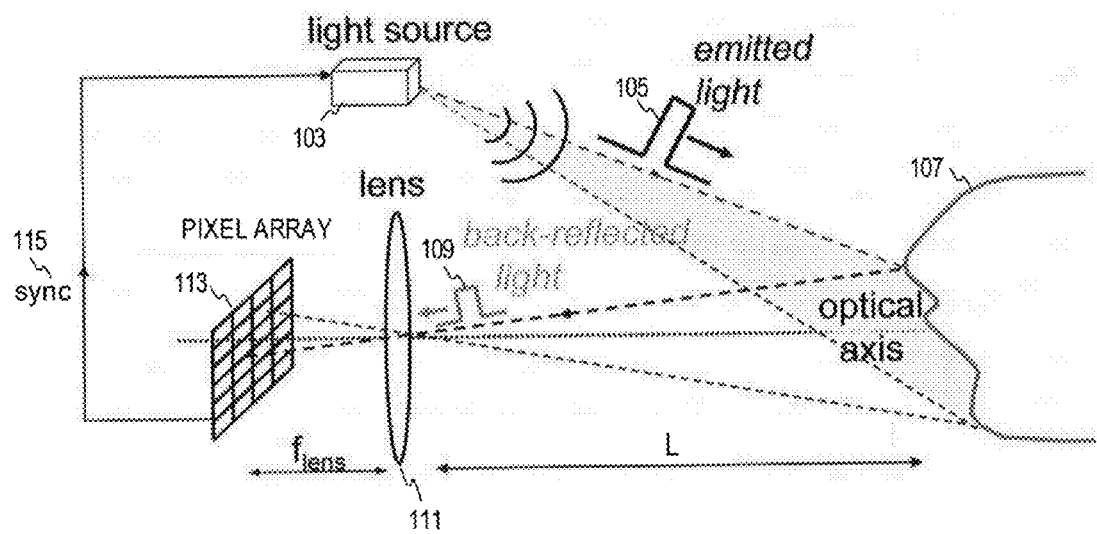
FIG. 1A is a block diagram that shows one example of a time of flight sensing system in accordance with the teachings of the present invention.

To illustrate, FIG. 1A is a block diagram that shows one example of a time of flight sensing system 101 in accordance with the teachings of the present invention. As shown, time of flight sensing system 101 includes light source 103 that emits modulated pulses, which are illustrated as emitted light 105 in FIG. 1A. As shown, emitted light 105 is directed to an object 107. In one example, emitted light 105 includes pulses of infrared (IR) light. It is appreciated that in other examples, emitted light 105 may have wavelengths other than infrared, such as for example visible light, near-infrared light, etc., in accordance with the teachings of the present invention. Emitted light 105 is then reflected back from object 107, which is shown as back-reflected light 109 in FIG. 1A. As shown, reflected light 109 is directed from object 107 through lens 111 and is then focused onto time of flight pixel array 113. In one example, time of flight pixel array 113 includes a plurality of time of flight pixels arranged in a two dimensional array. As will be discussed, in one example, sync signal 115 is generated by control circuitry coupled to time of flight pixel array 113, which synchronizes the pulses of emitted light 105 with corresponding modulation signals that control the plurality of pixels in time of flight pixel array 113 in accordance with the teachings of the present invention.

In the example depicted in FIG. 1A, time of flight pixel array 113 is positioned at a focal length $f_{lens}$ from lens 111. As shown in the example, the light source and the lens 111 are positioned a distance L from the object. It is appreciated of course the FIG. 1A is not illustrated to scale and that in one example, the focal length $f_{lens}$ is substantially less than the distance L between lens 111 and object 107. Therefore, it is appreciated that for the purposes of this disclosure, the distance L and the distance L+focal length $f_{lens}$ are substantially equal for purposes of time of flight measurements in accordance with the teachings of the present invention.

Figure 1B:
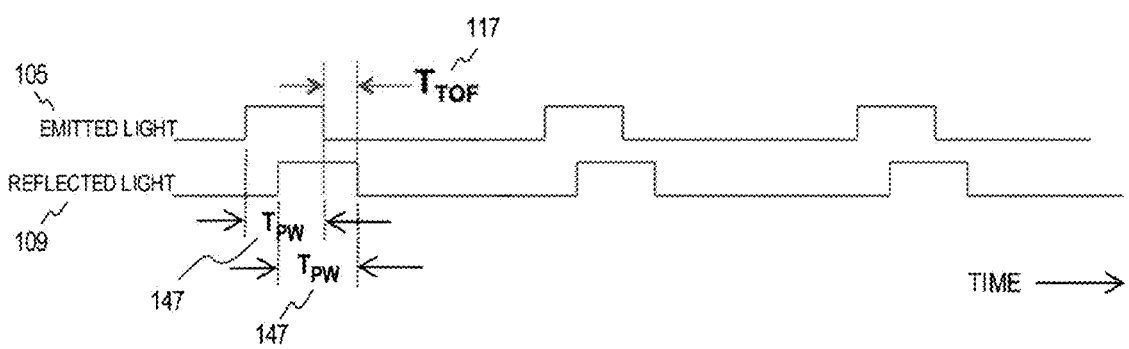
FIG. 1B is a timing diagram that shows an example of light pulses emitted from a light source relative to the receipt of the reflected light pulses in an example time of flight imaging system accordance with the teachings of the present invention.

FIG. 1B is a timing diagram that illustrates the timing relationship between example pulses of light emitted from a light source relative to the receipt of the back-reflected pulses of light in an example time of flight imaging system accordance with the teachings of the present invention. Specifically, FIG. 1B shows emitted light 105, which represents the modulated light pulses that are emitted from light source 103 to object 107. FIG. 1B also shows a reflected light 109, which represents the reflected light pulses that are back-reflected from object 107 and received by pixel array 113. In one example, the light source 103 emits the light pulses of emitted light 105 with a duty cycle of less than 10%. In one example, the pulse widths $T_{PW}$ 147 of the light pulses have a duration in the range of 20 nanoseconds to 100 nanoseconds. It is appreciated of course that other duty cycles and pulse widths for emitted light 105 may also be utilized in accordance with the teachings of the present invention. As shown, the light pulses of emitted light 105 and reflected light 109 all have the same pulse widths $T_{PW}$ 147.

As shown in the depicted example, due to the amount of time that it takes for the light pulses to travel the distance L from light source 103 to object 107, and then the additional time it take for the reflected light pulses to travel the distance L back from object 107 to pixel array 113, there is a delay time of $T_{TOF}$ 117 between the emission of light pulse of emitted light 105 and the receipt of that light pulse in reflected light 109. The time difference $T_{TOF}$ 117 between emitted light 105 and reflected light 109 represents the time of flight for the light pulses to make the round trip between the light source 103 and object 107. Once the time of flight $T_{TOF}$ 117 is known, the distance L from light source 103 to object 107 can be determined using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ is the amount of time that it takes for the light pulse to travel to and from the object as shown in FIG. 1A.

Figure 2:
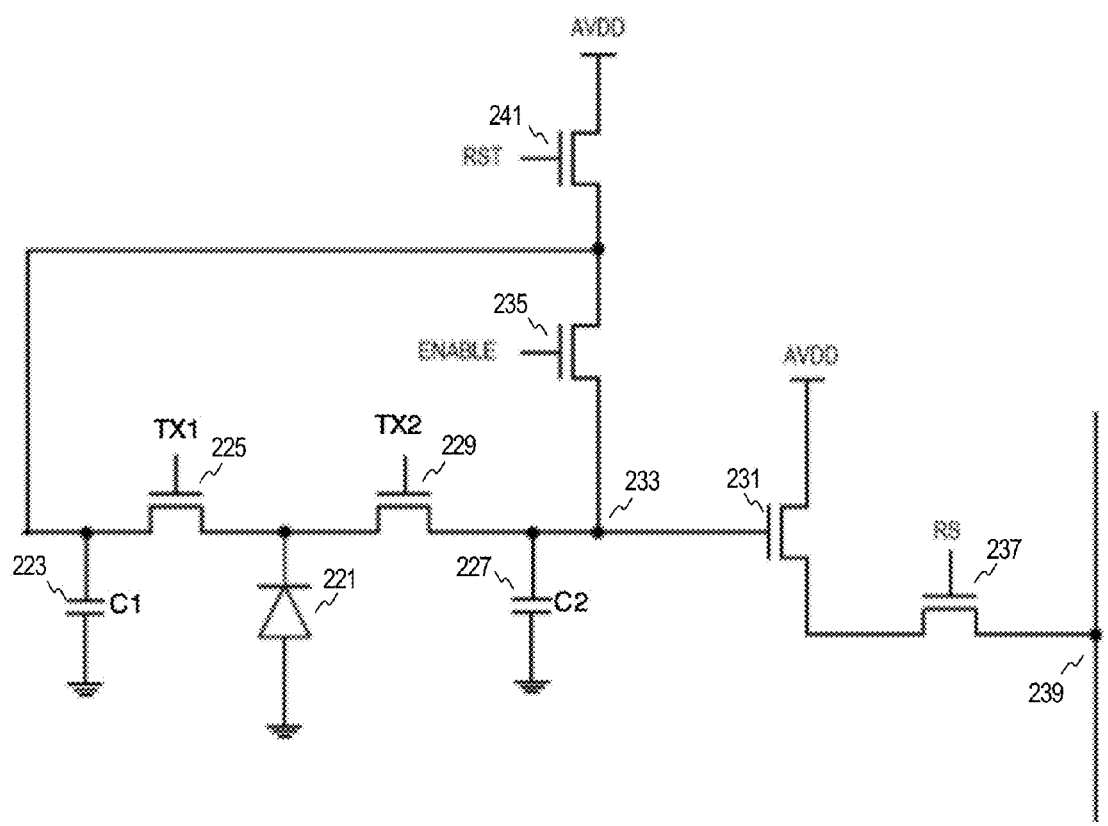
FIG. 2 is a schematic illustrating one example of a time of flight pixel in accordance with the teachings of the present invention.

FIG. 2 is a schematic illustrating one example of a time of flight pixel 219 in accordance with the teachings of the present invention. It is appreciated that pixel 219 can be one of the plurality of pixels included in the example pixel array 113 illustrated above in FIG. 1A. As shown in the example depicted in FIG. 2, pixel 219 includes photodiode 221, which accumulates charge in response to light incident upon photodiode 221. In one example, the light incident upon photodiode 221 is back-reflected light 109 as discussed above with respect to FIGS. 1A and 1B. In the example, first charge storage device 223 is included, and first transfer transistor 225 is coupled between photodiode 221 and first charge storage device 223 to selectively transfer charge to first charge storage device 223 from photodiode 221 in response to a first modulation signal, which is illustrated in FIG. 2 as TX1. As shown, second charge storage device 227 is also included, and second transfer transistor 229 is coupled between photodiode 221 and second charge storage device 227 to selectively transfer charge to second charge storage device 227 from photodiode 221 in response to a second modulation signal, which is illustrated in FIG. 2 as TX2. In one example, photodiode 221 is a single photodiode that is coupled to the first and second transistors 225 and 229. In one example, first and second charge storage devices 223 and 227 include capacitors C1 and C2 as shown.

As shown in the example, pixel 219 also includes amplifier transistor 231 that has a gate terminal coupled to readout node 233, which is coupled to second charge storage device 227. In one example, amplifier transistor 231 is coupled in a source follower configuration, which therefore amplifies an input signal at the gate terminal of amplifier transistor 231 to an output signal at the source terminal of amplifier transistor 231. As shown, row select transistor 237 is coupled to the source terminal of amplifier transistor 231 to selectively couple the output of amplifier transistor 231 to bitline 239 of pixel 219.

As shown in the depicted illustration, enable transistor 235 is coupled between first charge storage device 223 and readout node 233, which selectively couples first charge storage device 223 to readout node 233. Therefore, when enable transistor 235 is OFF, the signal at readout node 233 is representative of the total charge (e.g., Q2) stored in second charge storage device 227. However, when enable transistor 235 is ON, the signal at the readout node 233 is representative of a sum of total charge (e.g., Q1) stored in first charge storage device 223 and a total charge (e.g., Q2) stored in second charge storage device 227.

As shown in the example, pixel 219 also includes reset transistor 241 coupled to enable transistor 235 and first charge storage device 223. In one example, reset transistor 241 may be used to reset charge accumulated in photodiode 221 by selectively coupling photodiode 221 to an AVDD voltage through first transistor 225 and/or second transistor 229. In one example, the charge accumulated in photodiode 221 can be reset during an initialization period of pixel 219 or for example each time after charge information has been read out from pixel 219 and prior to accumulating charge in photodiode 221 for a new time of flight measurement in accordance with the teachings of the present invention.

Figure 3A:
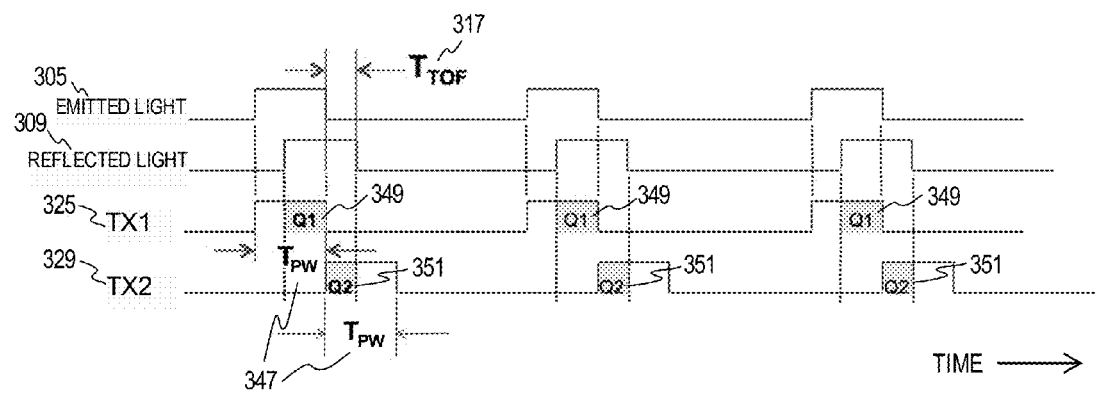
FIG. 3A is a timing diagram that shows an example of emitted pulses of light and the reflected pulses of the light relative to the switching of first and second transistors in an example time of flight imaging system accordance with the teachings of the present invention.
Figure 3B:
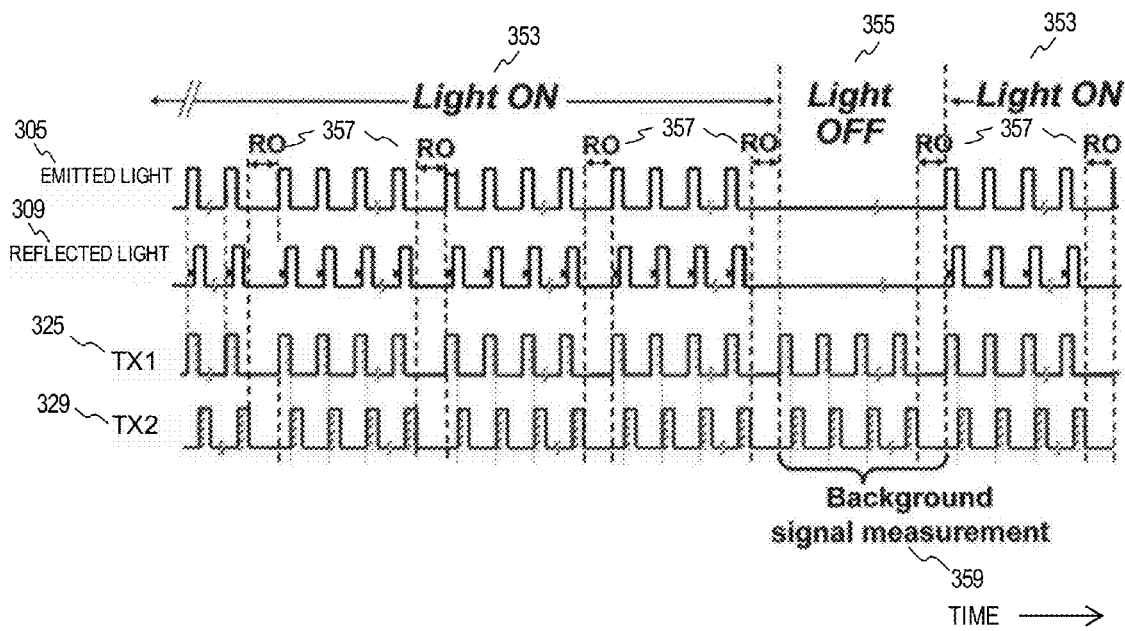
FIG. 3B is a timing diagram that shows another example of emitted pulses of light and the reflected pulses of the light relative to the switching of first and second transistors in an example time of flight imaging system accordance with the teachings of the present invention.

FIGS. 3A and 3B are example timing diagrams that may be used to help describe the operation of an example time of flight sensing system with an example time of flight pixel array as described in connection with FIGS. 1-2 above. Specifically, FIG. 3A is a timing diagram that shows an example of modulated pulses of emitted light 305, and the corresponding pulses of reflected light 309, relative to switching modulation signals TX1 325 and TX2 329, in an example time of flight imaging system accordance with the teachings of the present invention. In one example, modulation signal TX1 325 corresponds for example to the switching of first transistor 225 of FIG. 2 and modulation signal TX2 329 corresponds for example to the switching of second transistor 229 of FIG. 2 in accordance with the teachings of the present invention.

Referring now to the example depicted in FIG. 3A in combination with the example time of flight sensing system 101 illustrated in FIG. 1A, emitted light 305, which corresponds to emitted light 105, has a modulation frequency and is emitted from a light source 103 to an object 107. In one example, emitted light 305 has a duty cycle of less than 10% and a pulse width $T_{PW}$ 347 in the range of 20 nanoseconds to 100 nanoseconds. In the example, light pulses of reflected light 309, which corresponds to reflected light 109, are then reflected from object 107 back to pixel array 113 through lens 111. The light pulses of reflected light 309 are received by the pixels in pixel array 113 after time duration of $T_{TOF}$ 317 due to the time of flight of the light pulse to and from object 107. As shown in the example, reflected light 309 has the same modulation frequency of emitted light 305 as well as the same duty cycle and pulse width $T_{PW}$ 347.

Referring now to the example depicted in FIG. 3A in combination with the example time of flight pixel 219 illustrated in FIG. 2, photogenerated charge is accumulated in photodiode 221 of each pixel 219 in response to the illumination of photodiode 221 with reflected light 309. In one example, first transistor 225 is switched in response to first modulation signal TX1 325 and second transistor 229 is switched in response to second modulation signal TX2 329. As shown in the example depicted in FIG. 3A, first modulation signal TX1 325 has the same modulation frequency and is in-phase with emitted light 305. In one example, this synchronization between emitted light 305 and first modulation signal 325 may be achieved using the sync signal 115. In addition, each pulse of first modulation signal TX1 325 has the same on-time pulse width $T_{PW}$ 347 as emitted light 305. Accordingly, since each pulse of first modulation signal TX1 325 is in-phase with and has the same pulse width $T_{PW}$ 347 as each pulse of emitted light 305, each pulse of first modulation signal TX1 325 is switched OFF before the end of each pulse of reflected light 309.

As shown in the depicted example, second modulation signal TX2 329 also has the same modulation frequency and the same on-time pulse width $T_{PW}$ 347 as emitted light 305. However, second modulation signal TX2 329 is out-of-phase with first modulation signal TX2 325. Specifically, each pulse of second modulation signal TX2 329 immediately follows and does not overlap with each pulse of first modulation signal TX2 325. Accordingly, as shown in FIG. 3A, each pulse of second modulation signal TX2 329 is switched ON during an on-time pulse of reflected light 309.

Therefore, as shown in FIG. 3A, each on-time pulse of reflected light 309 is received by photodiode 221 during an ending portion of each pulse of first modulation signal TX1 325 and during a starting portion of each pulse of second modulation signal TX2 329 in accordance with the teachings invention.

As mentioned above, first transistor 225 is switched in response to first modulation signal TX1 325 and second transistor 229 is switched in response to second modulation signal TX2 329. Thus, during each on-time pulse of first modulation signal TX1 325, the photogenerated charge accumulated in photodiode 221 is transferred to first charge storage device 223. In the example, this photogenerated charge that is transferred from photodiode 221 to first charge storage device 223 in response to the first modulation signal TX1 325 is represented as Q1 349 in FIG. 3A. Similarly, during each on-time pulse of second modulation signal TX2 329, the photogenerated charge accumulated in photodiode 221 is transferred to second charge storage device 227. In the example, the photogenerated charge that is transferred from photodiode 221 to second charge storage device 223 in response to second modulation signal TX2 329 is represented as Q2 351 in FIG. 3A.

In one example, the time of flight $T_{TOF}$ 317 that it takes for the light emitted from light source 103 to travel to and from object 107 can be determined according to the following relationship in Equation (3) below:

$$T_{TOF} = T_{PW}\left(\frac{\sum Q2}{\sum (Q1 + Q2)}\right) \qquad (3)$$

where $T_{TOF}$ represents the time of flight $T_{TOF}$ 317, $T_{PW}$ represents the pulse width $T_{PW}$ 347, $\Sigma Q2$ represents the total amount of charge Q2 accumulated in second charge storage device 227 and $\Sigma(Q1+Q2)$ represents the sum of the total amount of charge accumulated in first and second charge storage devices 223 and 227. Once the time of flight $T_{TOF}$ 317 is determined, the $T_{TOF}$ result can then be substituted in to Equation (2) summarized above in order to determine the distance L in accordance with the teachings of the present invention.

Referring back to the example illustrated FIG. 2 above, it is appreciated that a number of the active devices in pixel 219 are shared for the purposes of accumulating charge and reading information from the first and second charge storage devices 223 and 227. This shared architecture not only reduces the number of required active devices compared to known time of flight pixel architectures, but also enables $\Sigma Q2$ and $\Sigma(Q1+Q2)$ to be obtained directly from the readout node 233 in accordance with the teachings of the present invention. Specifically, when the enable transistor 235 is switched OFF, the signal at readout node 233 is representative of the total charge Q2 accumulated in second charge storage device 227. The signal is received at the input gate terminal of amplifier transistor 231 and is output as a first signal representative of $\Sigma Q2$. This first signal may then be output through the row select transistor 237 to bitline 239.

When the enable transistor 235 is switched ON, first charge storage device 223 is also coupled to readout node 233. Therefore, the signal at readout node 233 is representative of the sum of the total amount of charge Q1 stored on the first charge storage device 223 and a total amount of charge Q2 stored on the second charge storage device 227. This signal is received at the input gate terminal of amplifier transistor 231 and is output as a second signal representative of $\Sigma(Q1+Q2)$. This second signal may then be output through the row select transistor 237 to bitline 239. With the first signal representative of $\Sigma Q2$ and the second signal representative of $\Sigma(Q1+Q2)$, the time of flight $T_{TOF}$ 317 can then be determined directly according to Equation (3) discussed above by multiplying the quotient of the first and second signals with the on-time pulse width $T_{PW}$ 347 in accordance with the teachings of the present invention. Thus, as mentioned above, it is appreciated that pixel 219 provides the first and second signals directly with shared active devices such as the single reset transistor 241, amplifier transistor 231, row select transistor 237 and photodiode 221 in accordance with the teachings of the present invention.

FIG. 3B is a timing diagram that shows another example of emitted pulses of light and the reflected pulses of the light relative to the switching of first and second transistors in an example time of flight imaging system accordance with the teachings of the present invention. It is appreciated that FIG. 3B is similar to FIG. 3A, but that the time scale along the x-axis of FIG. 3B is of a lower resolution than the time scale of FIG. 3A. As such, FIG. 3B illustrates an example where charge is allowed to accumulate in charge storage devices 223 and 227 over a plurality of cycles reflected light 309. In the example shown in FIG. 3B, the charge information is read out from pixel 219 during periods in which the light source is ON 353 at the times indicated by RO 357, which occurs after a plurality of reflected light pulses are allowed to illuminate the photodiode 221 and have charge Q1 and Q2 transferred to first and second charge storage devices 223 and 227, respectively. In so doing, charge is allowed to accumulate in charge storage devices 223 and 227 over a plurality of cycles, which provides improve an signal to noise ratio compared to a time of flight calculation based on only a single light pulse since the pulse width $T_{PW}$ 347 is so small due to the very short illumination pulses in the range of 20 nanoseconds to 100 nanoseconds.

FIG. 3B also illustrates an example in which the light source is OFF 355 for one or more periods to allow a background signal measurement 359 to be taken. In this example, background signals from the first and second charge storage devices 223 and 227 are measured periodically when the photodiode 221 is not illuminated with the reflected light 309. This measurement may be taken at the end of the light OFF 355 period as shown. In one example, this measurement may be representative of ambient light and/or dark current in the pixel, which would add noise to the time of flight calculations. In one example, this background signal measurement 359 may be stored as calibration information and may be subtracted from the measurements taken during the light ON 353 periods to compensate for background noise when determining the time of flight measurements of $T_{TOF}$ 317 in accordance with the teaching of the present invention.

Figure 4:
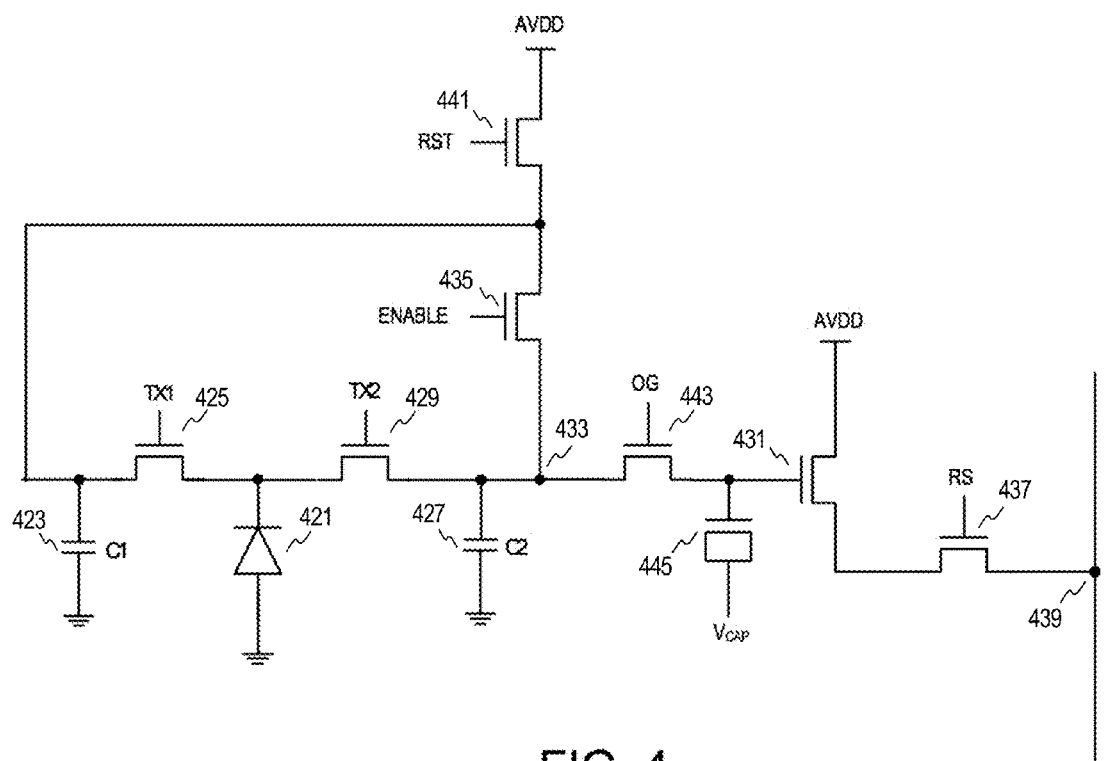
FIG. 4 is a schematic illustrating another example schematic of a time of flight pixel in accordance with the teachings of the present invention.

FIG. 4 is a schematic illustrating another example schematic of a time of flight pixel 419 in accordance with the teachings of the present invention. It is appreciated that time of flight pixel 419 shares many similarities with time of flight pixel 219 of FIG. 2, and may also be included in example time of flight pixel array 113 of FIG. 1A. For instance, like time of flight pixel 219, time of flight pixel 419 includes photodiode 421, first charge storage device 423, and first transfer transistor 425 is coupled between photodiode 421 and first charge storage device 423 to selectively transfer charge in response to a first modulation signal TX1. In addition, time of flight pixel 419 also includes second charge storage device 427 and second transfer transistor 429 is coupled between photodiode 421 and second charge storage device 427 to selectively transfer charge to second charge storage device 427 in response to second modulation signal TX2. In one example, photodiode 421 is a single photodiode that is coupled to the first and second transistors 425 and 429. In addition, enable transistor 435 is coupled between first charge storage device 423 and readout node 433 to selectively couple first charge storage device 423 to readout node 433. Furthermore, reset transistor 441 coupled to enable transistor 435 and first charge storage device 423, which may be used to reset the charge accumulated in photodiode 421 by selectively coupling photodiode 421 to the AVDD voltage through first transistor 425 and/or second transistor 429.

A difference between example time of flight pixel 419 and example time of flight pixel 219 of FIG. 2 is the inclusion of output transistor 443 coupled between readout node 433 and the gate terminal of amplifier transistor 431 in time of flight pixel 419. In addition, time of flight pixel 419 includes a third charge storage device coupled to the gate terminal of amplifier transistor 431 and output transistor 443 as shown in the example depicted in FIG. 4. In one example, third charge storage device includes a capacitively coupled transistor as illustrated in FIG. 4. In the illustrated example, charge may be transferred from readout node 433 to third charge storage device 445 in response to the switching of output transistor 443. In one example, the charge is transferred from first and/or or second charge storage devices 423 and/or 427 through readout node 433 to third charge storage device 445 prior to the amplification of the signal at readout node 433.

Similar to time of flight pixel 219, amplifier transistor 431 of time of flight pixel 419 is coupled in a source follower configuration, which therefore amplifies an input signal at the gate terminal of amplifier transistor 431 to an output signal at the source terminal of amplifier transistor 431. As shown, row select transistor 437 is coupled to the source terminal of amplifier transistor 431 to selectively couple the output of amplifier transistor 431 to bitline 439 of time of flight pixel 419.

Figure 5:
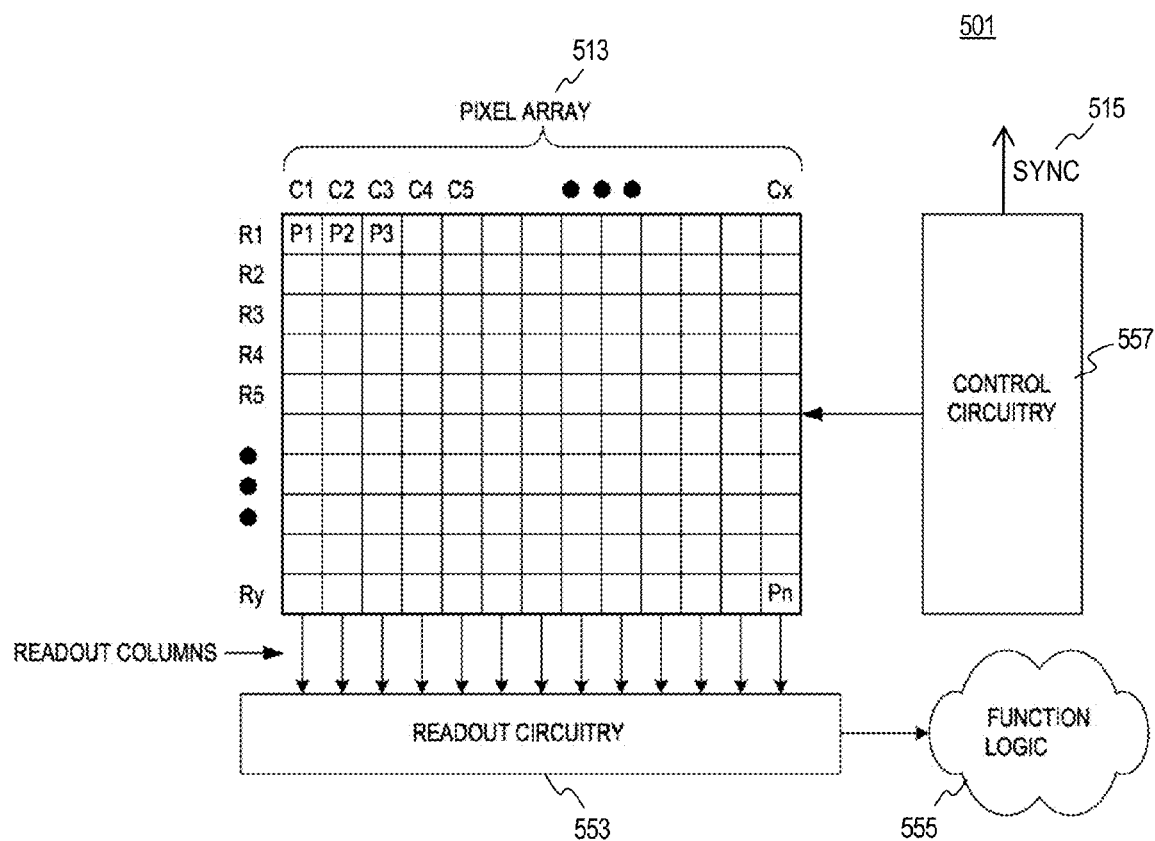
FIG. 5 is block diagram that shows a portion of an example time of flight sensing system including a time of flight pixel array with corresponding readout circuitry, control circuitry and function logic in accordance with the teachings of the present invention.

FIG. 5 is block diagram that shows a portion of an example time of flight sensing system 501 in greater detail in accordance with the teachings of the present invention. As shown, the illustrated example of time of flight sensing system 501 includes a time of flight pixel array 513, readout circuitry 553, function logic 555, and control circuitry 557. It is appreciated that time of flight pixel array 513 corresponds with time of flight pixel array 113 of FIG. 1A.

In the example illustrated in FIG. 5, pixel array 513 is a two dimensional (2D) array of time of flight pixels (e.g., pixels P1, P2 . . . , Pn). In one example, each of the time of flight pixels P1, P2, . . . , Pn may be substantially similar to one of the time of flight pixels discussed above in FIGS. 1-4. As illustrated, each pixel is arranged into a row (e.g., rows R1 to Ry) and a column (e.g., column C1 to Cx) to acquire time of flight data of an object image focused onto pixel array 513. Thus, the time of flight data can then be used to determine the distance or depth information to the object in accordance with the teachings of the present invention.

In one example, after each pixel has accumulated its Q1 and Q2 charge information in the respective charge storage devices as discussed above, the Q2 and Q1+Q2 signals are readout by readout circuitry 553 and transferred to function logic 555 for processing. Readout circuitry 553 may include amplification circuitry, analog-to-digital conversion (ADC) circuitry, or otherwise. In one example, function logic 555 may determine the time of flight and distance information for each pixel. In one example, function logic may also store the time of flight information and/or even manipulate the time of flight information (e.g., crop, rotate, adjust for background noise, or the like). In one example, readout circuitry 553 may readout a row of image data at a time along readout column lines (illustrated) or may readout the image data using a variety of other techniques (not illustrated), such as a serial readout or a full parallel readout of all pixels simultaneously.

In the illustrated example, control circuitry 557 is coupled to pixel array 513 to control the operation of pixel array 513. For example, control circuitry 557 may generate the first modulation signals TX1 125, 225, 325 or 425 and second modulation signals TX2 129, 229, 329 or 429 signals to control the respective first and second transistors in each pixel of pixel array 513. Accordingly, control circuitry 557 may control the transfer of charge from the respective photodetectors to the charge storage devices as described above with respect to FIGS. 1-4. In one example, control circuitry 557 may also control the light source that emits the light pulses to the object with sync signal 515, similar to for example light source 103 of FIG. 1, to synchronize the emission of the modulated light to the object to determine the time of flight information in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   a photodiode to accumulate charge in response to light incident upon the photodiode;
   a first charge storage device;
   a first transfer transistor coupled between the photodiode and the first charge storage device to selectively transfer charge to the first charge storage device from the photodiode;
   a second charge storage device;
   a second transfer transistor coupled to between the photodiode and the second charge storage device to selectively transfer charge to the second charge storage device from the photodiode;
   an enable transistor coupled between the first charge storage device and a readout node coupled to the second charge storage device to selectively couple the first charge storage device to the readout node; and
   an amplifier transistor having a gate coupled to the readout node;
   wherein a signal at the readout node is representative of a sum of total charge stored in the first charge storage device and a total charge stored in the second charge storage device when the enable transistor is ON.

2. The apparatus of claim 1 further comprising a row select transistor coupled between an output of the amplifier transistor and a bitline.

3. The apparatus of claim 1 further comprising a reset transistor coupled to the enable transistor to selectively reset charge accumulated in the photodiode.

4. The apparatus of claim 1 further comprising an output transistor coupled between the readout node and the gate of the amplifier transistor.

5. The apparatus of claim 4 further comprising a third charge storage device coupled to the gate of the amplifier transistor.

6. The apparatus of claim 1 wherein a signal at the readout node is representative of a total charge stored in the second charge storage device when the enable transistor is OFF.

7. The apparatus of claim 1 wherein the photodiode is a single photodiode coupled to the first and second transistors.

8. A method of determining time of flight using a pixel, the method comprising
   emitting modulated light to an object from a light source, wherein the modulated light has a modulation frequency and an on-time pulse width;
   illuminating a photodiode with the modulated light reflected from the object;
   accumulating charge in the photodiode in response to the modulated light reflected from the object;
   transferring photogenerated charge from the photodiode to a first charge storage device in response to a first modulation signal, wherein the first modulation signal has the modulation frequency and the on-time pulse width, and wherein the first modulation signal is in-phase with the modulated light emitted at the object;
   transferring photogenerated charge from the photodiode to a second charge storage device in response to a second modulation signal, wherein the second modulation signal has the modulation frequency and the on-time pulse width, and wherein the second modulation signal is out-of-phase with the first modulated signal;
   generating a first signal in response to a total amount of charge stored on the second charge storage device;
   generating a second signal in response to a sum of the total amount of charge stored on the first charge storage device and a total amount of charge stored on the second charge storage device; and
   determining a time of flight of the modulated light reflected from the object in response to the first and second signals.

9. The method of claim 8 wherein determining the time of flight of the modulated light reflected from the object comprises multiplying a quotient of the first signal and the second signal with the on-time pulse width.

10. The method of claim 8 wherein transferring photogenerated charge from the photodiode to the first charge storage device comprises switching a first transfer transistor coupled between the photodiode and the first charge storage device in response to the first modulated signal.

11. The method of claim 8 wherein transferring photogenerated charge from the photodiode to the second charge storage device comprises switching a second transfer transistor coupled between the photodiode and the second charge storage device in response to the second modulated signal.

12. The method of claim 8 wherein generating the first signal comprises setting a readout node to be coupled to the first charge storage device and amplifying a signal at the readout node coupled to the first charge storage device.

13. The method of claim 12 further comprising transferring charge from a readout node coupled to the first charge storage device to a third charge storage device coupled to a gate of an amplifier transistor prior to amplifying the signal.

14. The method of claim 8 wherein generating the second signal comprises setting a readout node to be coupled to the first and second charge storage devices and amplifying a signal at the readout node coupled to the first and second charge storage devices.

15. The method of claim 14 further comprising transferring charge from a readout node coupled to the first and second charge storage devices to a third charge storage device coupled to a gate of an amplifier transistor prior to amplifying the signal.

16. The method of claim 8 further comprising resetting the photodiode prior to accumulating charge in response to the modulated light reflected from the object.

17. The method of claim 8 further comprising sampling background signals from the first and second charge storage devices when the photodiode is not illuminated with the modulated light reflected from the object and subtracting the background signals from the first and second signals when determining the time of flight of the modulated light reflected from the object.

18. The method of claim 8 wherein each pulse of the second modulation signal immediately follows each pulse of the first modulated signal.

19. The method of claim 8 further comprising:
periodically measuring a background signal of charge in the photodiode when there is no illumination from the modulated light reflected from the object; and
calibrating the pixel with the periodically measured background signal to compensate for background noise in pixel.

20. A time of flight sensing system, comprising:
a light source to emit modulated light to an object;
a time of flight pixel array having a plurality of pixels, wherein each one of the pixels comprises:
a photodiode to accumulate charge in response to the modulated light reflected from the object incident upon the photodiode;
a first charge storage device;
a first transfer transistor coupled to between the photodiode and the first charge storage device to selectively transfer charge to the first charge storage device from the photodiode;
a second charge storage device;
a second transfer transistor coupled to between the photodiode and the second charge storage device to selectively transfer charge to the second charge storage device from the photodiode;
an enable transistor coupled between the first charge storage device and a readout node coupled to the second charge storage device to selectively couple the first charge storage device to the readout node; and
an amplifier transistor having a gate coupled to the readout node;
wherein a signal at the readout node is representative of a sum of total charge stored in the first charge storage device and a total charge stored in the second charge storage device when the enable transistor is ON.

21. The system of claim 20, wherein each one of the pixels further comprises a row select transistor coupled between an output of the amplifier transistor and a bitline.

22. The system of claim 20, wherein each one of the pixels further comprises a reset transistor coupled to the enable transistor to selectively reset charge accumulated in the photodiode.

23. The system of claim 20, wherein each one of the pixels further comprises an output transistor coupled between the readout node and the gate of the amplifier transistor.

24. The system of claim 23, wherein each one of the pixels further comprises further comprises a third charge storage device coupled to the gate of the amplifier transistor.

25. The system of claim 20 wherein a signal at the readout node is representative of a total charge stored in the second charge storage device when the enable transistor is OFF.

26. The system of claim 20 wherein the photodiode is a single photodiode coupled to the first and second transistors.

* * * * *